(12) United States Patent
Tauchi et al.

(10) Patent No.: US 7,811,637 B2
(45) Date of Patent: Oct. 12, 2010

(54) SILICON-CONTAINING POLYMER, PROCESS FOR PRODUCING THE SAME, HEAT-RESISTANT RESIN COMPOSITION, AND HEAT-RESISTANT FILM

(75) Inventors: Kunikazu Tauchi, Nagoya (JP); Hiroshi Suzuki, Nagoya (JP)

(73) Assignee: Toagosei Co., Ltd., Tokyo (JP)

( * ) Notice: Subject to any disclaimer, the term of this patent is extended or adjusted under 35 U.S.C. 154(b) by 1123 days.

(21) Appl. No.: 10/565,682

(22) PCT Filed: Jul. 29, 2004

(86) PCT No.: PCT/JP2004/010853

§ 371 (c)(1),
(2), (4) Date: Jun. 28, 2006

(87) PCT Pub. No.: WO2005/010077

PCT Pub. Date: Feb. 3, 2005

(65) Prior Publication Data

US 2007/0134424 A1 Jun. 14, 2007

(30) Foreign Application Priority Data

Jul. 29, 2003 (JP) .............................. 2003-203411
Jul. 29, 2003 (JP) .............................. 2003-203412

(51) Int. Cl.
*B05D 3/02* (2006.01)
(52) U.S. Cl. .................... 427/387; 428/447; 528/32; 528/43
(58) Field of Classification Search .................. 528/43, 528/10–14, 15, 39, 31–34; 427/387; 430/270.1, 430/170, 192; 428/447
See application file for complete search history.

(56) References Cited

U.S. PATENT DOCUMENTS

| | | | |
|---|---|---|---|
| 4,745,169 A | 5/1988 | Sugiyama et al. | |
| 4,946,921 A * | 8/1990 | Shirahata et al. | 528/39 |
| 6,596,404 B1 | 7/2003 | Albaugh et al. | |
| 2006/0003252 A1 * | 1/2006 | Hirayama et al. | 430/170 |

FOREIGN PATENT DOCUMENTS

| | | |
|---|---|---|
| EP | 0 342 648 A2 | 11/1989 |
| EP | 1 059 322 A2 | 12/2000 |
| JP | 62-96526 | 5/1987 |
| JP | 1-123229 | 5/1989 |
| JP | 1-292036 | 11/1989 |
| JP | 3-119028 | 5/1991 |
| JP | 4-184444 | 7/1992 |
| JP | 5-323612 | 12/1993 |
| JP | 6-128378 | 5/1994 |
| JP | 6-148895 | 5/1994 |
| JP | 8-245792 | 9/1996 |
| JP | 9-249749 | 9/1997 |
| JP | 9-296044 | 11/1997 |
| JP | 2000-169585 | 6/2000 |
| JP | 2000-265065 | 9/2000 |
| JP | 2001-89662 | 4/2001 |
| JP | 2001-288267 | 10/2001 |
| JP | 2003-255546 | 9/2003 |
| JP | 2004-161867 | 6/2004 |

OTHER PUBLICATIONS

European Patent Office Communication pursuant to Article 94(3) EPC in corresponding Application No. 09 169 247.5-2115, dated Jun. 18, 2010.
Walter Noll, Chemistry and Technology of Silicones (Chemie und Technologie der Silicone), Second Edition, Academic Press, 1968, pp. 214, 215, 218.

* cited by examiner

*Primary Examiner*—James Seidleck
*Assistant Examiner*—S. Camilla Pourbohloul
(74) *Attorney, Agent, or Firm*—Oblon, Spivak, McClelland, Maier & Neustadt, L.L.P.

(57) ABSTRACT

The alkali-soluble silicon-containing polymer of the present invention is represented by the general formula (1) below and has a weight-average molecular weight in the range from 500 to 500,000:

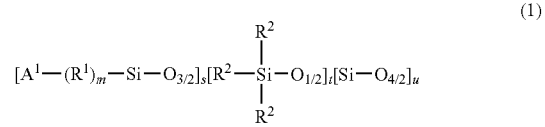

(1)

(In the formula, $A^1$ is a phenyl group having either a hydroxyl group or an alkoxy group; $R^1$ is an alkylene group of 1-4 carbons; m is 0 or 1; $R^2$ is an alkyl group of 1-4 carbons; each of s and u is a positive number; t is 0 or a positive number; $0 \leq t/(s+u) \leq 1$; and $0 < u/s \leq 5$).

9 Claims, No Drawings

SILICON-CONTAINING POLYMER, PROCESS FOR PRODUCING THE SAME, HEAT-RESISTANT RESIN COMPOSITION, AND HEAT-RESISTANT FILM

TECHNICAL FIELD

The present invention relates to a silicon-containing polymer and a method for manufacturing the same, a heat-resistant resin composition and a heat-resistant film. More specifically, the present invention relates to a silicon-containing polymer that is soluble in an alkaline solution and is novel, and a manufacturing method thereof; another novel silicon-containing polymer and a heat-resistant resin composition comprising a hydrosilylated polymer obtained using the same; and a heat-resistant film formed by thermal hydrosilylation of the silicon-containing polymer.

The alkali-soluble silicon-containing polymer of the present invention is useful in alkaline developable resist materials and the like.

The other silicon-containing polymer of the present invention is useful in the fields of electronics, optically functional materials, and the like.

In addition, the heat-resistant resin composition and heat-resistant film of the present invention are useful as aerospace materials, semiconductor materials, and the like, due to their extremely high heat-resistance.

BACKGROUND ART

As an alkali-soluble silicon-containing polymer, polyorganosilsesquioxanes disclosed in patent reference 1 below, organopolysiloxanes disclosed in patent reference 2 below, and the like are generally known.

Additionally, as a heat-resistant resin composition in which a silicon-containing compound is used, copolymers of a hydrogenated octasilsesquioxane and a vinyl group-containing compound disclosed in patent reference 3 below, silicon-containing curable compositions disclosed in patent reference 4 below, silsesquioxane-containing polymers disclosed in patent reference 5 below, and the like are known.

[Patent reference 1] JP-A S62-96526
[Patent reference 2] JP-A H1-292036
[Patent reference 3] JP-A 2000-265065
[Patent reference 4] JP-A 2001-89662
[Patent reference 5] JP-A H9-296044

DISCLOSURE OF THE INVENTION

Problems to be Solved by the Invention

According to the alkali-soluble silicon-containing polymers disclosed in patent references 1 and 2 mentioned above, there is drawback where a compound having a high molecular weight is difficult to obtain.

On the other hand, according to the heat-resistant resin composition disclosed in patent references 3 and 4 mentioned above, a heat resistance where weight loss rate in nitrogen atmosphere at 1,000° C. is 5% or less was not obtained. In addition, the heat-resistant resin compositions disclosed in patent references 3 and 5 mentioned above are impractical since they use a difficult-to-isolate and extremely expensive hydrogenated octasilsesquioxane as a starting material, and further have drawbacks in that a monomer having an unsaturated group vaporizes during heat polymerization to form an outgas, and contaminate the working environment.

An objective of the present invention is to provide a novel alkali-soluble silicon-containing polymer which has a high molecular weight, and a method for manufacturing the same.

In addition, another objective of the present invention is to provide a novel silicon-containing polymer whereby a cured material having extremely high heat resistance is obtained by a simple method that does not use expensive starting materials, and whereby a gas that contaminates the working environment is not generated even when the polymer is heated, and a heat-resistant resin composition comprising its hydrosilylated polymer and a heat-resistant film.

MEANS FOR SOLVING PROBLEMS

The present invention is as follows.

1. An alkali-soluble silicon-containing polymer which is represented by the general formula (1) below and has a weight-average molecular weight in the range from 500 to 500,000:

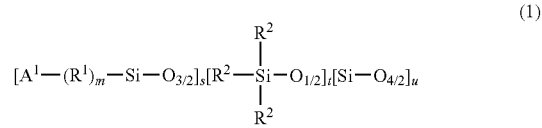

(In the formula, $A^1$ is a phenyl group having either a hydroxyl group or an alkoxy group; $R^1$ is an alkylene group of 1-4 carbons; m is 0 or 1; $R^2$ is an alkyl group of 1-4 carbons ($R^2$ in one molecule may be the same type or a combination of two or more different types.); each of s and u is a positive number; t is 0 or a positive number; $0 \leq t/(s+u) \leq 1$; and $0 < u/s \leq 5$).

2. The alkali-soluble silicon-containing polymer according to 1 above, wherein $0 \leq t/(s+u) \leq 0.2$ and $0.2 < u/s \leq 5$ are in the general formula (1) and the polymer is solid at room temperature.

3. A method for manufacturing the alkali-soluble silicon-containing polymer represented by the general formula (1) above, being characterized in performing hydrolytic co-condensation of s moles of an organosilane having a hydrolysable group represented by the general formula (2) below, t moles of an organosilane having a hydrolysable group represented by the general formula (3) below, and u moles of a silicon compound having a hydrolysable group represented by the general formula (4) below (wherein s and u are positive numbers; t is 0 or a positive number; $0 \leq t/(s+u) \leq 1$; and $0 < u/s \leq 5$).

(In the formula, $A^1$ is a phenyl group having either a hydroxyl group or an alkoxy group; $R^1$ is an alkylene group of 1-4 carbons; $M^1$ is a hydrolysable group; and m is 0 or 1.)

(In the formula, $R^2$ is an alkyl group of 1-4 carbons; and $M^2$ is a hydrolysable group.)

(In the formula, $M^3$ is a hydrolysable group.)

4. A silicon-containing polymer which is represented by the general formula (5) below and has a weight-average molecular weight in the range from 500 to 500,000:

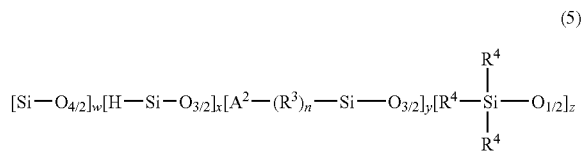

(5)

(In the formula, $A^2$ is an organic group of 2-10 carbons, having a carbon-carbon unsaturated group; $R^3$ is an alkylene group of 1-20 carbons, a bivalent aromatic group of 6-20 carbons, or a bivalent alicyclic group of 3-20 carbons; n is 0 or 1; $R^4$ is a hydrogen atom or an alkyl group of 1-10 carbons ($R^4$ in one molecule may be the same type or a combination of two or more different types.); each of x and y is a positive number; each of w and z is 0 or a positive number; $0 \leq z/(w+x+y) \leq 2$; and $0.01 \leq y/(w+x) \leq 5$).

5. A heat-resistant resin composition comprising a hydrosilylated polymer obtained by a reaction between a hydrogen atom bonded to a silicon atom in the silicon-containing polymer according to 4 above, and a carbon-carbon unsaturated group in another silicon-containing polymer according to 4 above.

6. The heat-resistant resin composition according to 5 above, having a weight loss rate of 5% or less when heated from 25° C. to 1,000° C. at a rate of temperature increase of 10° C./minute in nitrogen atmosphere.

7. A heat-resistant film, which is obtained by spreading an organic solvent solution of the silicon-containing polymer according to 4 above on a substrate and curing the coated film by thermal hydrosilylation.

EFFECTS OF THE INVENTION

The alkali-soluble silicon-containing polymer of the present invention has a specific structure and is excellent in alkali solubility in spite of its high molecular weight. Additionally, containing prescribed quantities of specific units leads to a softening point having wide range, and the polymer is suitable in resist materials and other applications.

According to the manufacturing method of the alkali-soluble silicon-containing polymer of the present invention, using specific starting components easily leads to a compound having a high molecular weight.

According to the other silicon-containing polymer of the present invention, it is possible to obtain a cured material that has a specific structure and high heat resistance and does not generate any gas contaminating the working environment during heating.

According to the heat-resistant resin composition of the present invention, the weight loss rate when the composition is heated from 25° C. to 1,000° C. at a rate of temperature of 10° C./minute in nitrogen atmosphere can be kept to 5% or less.

According to the heat-resistant film of the present invention, the weight loss rate when the composition is heated from 25° C. to 1,000° C. at a rate of temperature of 10° C./minute in nitrogen atmosphere can be kept to 5% or less.

BEST MODE FOR CARRYING OUT THE INVENTION

The present invention will be described in detail hereinafter.

1. Alkali-Soluble Silicon-Containing Polymer

The alkali-soluble silicon-containing polymer (also referred to as "polymer (I)") is represented by the general formula (1) below and has a weight-average molecular weight in the range from 500 to 500,000.

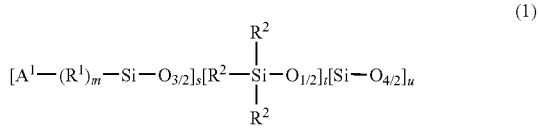

(1)

(In the formula, $A^1$ is a phenyl group having either a hydroxyl group or an alkoxy group; $R^1$ is an alkylene group of 1-4 carbons; m is 0 or 1; $R^2$ is an alkyl group of 1-4 carbons ($R^2$ in one molecule may be the same type or a combination of two or more different types.); each of s and u is a positive number; t is 0 or a positive number; $0 \leq t/(s+u) \leq 1$; and $0 < u/s \leq 5$).

The silicon-containing polymer (I) of the present invention comprises, as represented by the general formula (1) above, a trifunctional siloxane unit represented by the general formula (6) below, a monofunctional siloxane unit represented by the general formula (7) below, and a tetrafunctional siloxane unit represented by the formula (8) below. These units may each be bonded with any same or different siloxane unit.

(6)

(In the formula, $A^1$ is a phenyl group having either a hydroxyl group or an alkoxy group; $R^1$ is an alkylene group of 1-4 carbons; and m is 0 or 1.)

(7)

(In the formula, $R^2$ is an alkyl group of 1-4 carbons.)

(8)

In general formulae (1) and (6) above, $A^1$ is a phenyl group having either a hydroxyl group or an alkoxy group, and the hydroxyl group or the alkoxy group bonded to this phenyl group may each be alone or two or more types.

Preferred examples of $A^1$ include o-hydroxyphenyl group, m-hydroxyphenyl group, p-hydroxyphenyl group, 2,3-dihydroxyphenyl group, 2,4-dihydroxyphenyl group, 3,4-dihydroxyphenyl group, 3,5-dihydroxyphenyl group, o-methoxyphenyl group, m-methoxyphenyl group, p-methoxyphenyl group, 2,3-dimethoxyphenyl group, 2,4-dimethoxyphenyl group, 3,4-dimethoxyphenyl group, 3,5-dimethoxyphenyl group, o-ethoxyphenyl group, m-ethoxyphenyl group, p-ethoxyphenyl group, 2,3-diethoxyphenyl group, 2,4-diethoxyphenyl group, 3,4-diethoxyphenyl group, 3,5-diethoxyphenyl group, o-isopropoxyphenyl group, m-isopropoxyphenyl group, p-isopropoxyphenyl group, 2,3-di-isopropoxyphenyl group, 2,4-di-isopropoxyphenyl group, 3,4-di-isopropoxyphenyl group, 3,5-di-isopropoxyphenyl group, ortho-tert-butoxyphenyl group, meta-tert-butoxyphenyl group, p-tert-butoxyphenyl group, 2,3-di-tert-butoxyphenyl group, 2,4-di-tert-butoxyphenyl group, 3,4-di-tert-butoxyphenyl group, 3,5-di-tert butoxyphenyl group, 2-methoxy-3-hydroxyphenyl group, 2-methoxy-4-hydroxyphenyl group, 3-methoxy-4-hydroxyphenyl group, 3-methoxy-5-hydroxyphenyl group, 2-hydroxy-3-methoxyphenyl group, 2-hydroxy-4-methoxyphenyl group, 3-hydroxy-4-methoxyphenyl group, 3-hydroxy-5-methoxyphenyl group, 2-ethoxy-3-hydroxyphenyl group, 2-ethoxy-4-hydroxyphenyl group, 3-ethoxy-4-hydroxyphenyl group, 3-ethoxy-5-hydroxyphenyl group, 2-hydroxy-3-ethoxyphenyl group, 2-hydroxy-4-ethoxyphenyl group, 3-hydroxy-4-ethoxyphenyl group, 3-hydroxy-5-ethoxyphenyl group and the like.

In the polymer (I) of the present invention, $A^1$ in one molecule may be the same type or a combination of two or more different types when $s \geq 2$.

In general formulae (1) and (6), $R^1$ is an alkylene group of 1-4 carbons. Preferred examples of $R^1$ include methylene group, ethylene group, n-propylene group, i-propylene group, n-butylene group, i-butylene group and the like.

Also in the formulae above, m is 0 or 1.

In general formulae (1) and (7), $R^2$ is an alkyl group of 1-4 carbons. Preferred examples of $R^2$ include methyl group, ethyl group, n-propyl group, i-propyl group, n-butyl group, i-butyl group and the like.

$R^2$ contained in the polymer (I) of the present invention may be the same type or a combination of two or more different types.

In the general formula (1), s and u are positive numbers, t is 0 or a positive number, $0 \leq t/(s+u) \leq 1$ and $0 < u/s \leq 5$. In the case of being out of these ranges, syntheses are difficult and the polymer (I) of the present invention does not have alkali solubility. When s, t and u satisfy $0 \leq t/(s+u) \leq 0.2$ and $0.2 < u/s \leq 5$, the silicon-containing polymer (I) of the present invention is solid at room temperature (25° C.) and is easy to handle.

The polymer (I) of the present invention may comprise some hydroxyl groups, alkoxy groups, halogen atoms and the like that are remained in the manufacturing process.

The weight-average molecular weight (Mw) of the silicon-containing polymer (I) of the present invention is in the range from 500 to 500,000 as measured by gel permeation chromatography (hereinafter referred to as "GPC") using standard polystyrene. In the case of being out of these ranges, syntheses are difficult.

The silicon-containing polymer of the present invention can be soluble in an alkaline aqueous solution such as an aqueous solution of sodium hydroxide and an aqueous solution of tetramethyl ammonium hydroxide, and can also be soluble in various organic solvents such as hydrocarbon solvents, aromatic-based hydrocarbon solvents, chlorinated hydrocarbon solvents, alcohol solvents, ether solvents, amide solvents, ketone solvents, ester solvents and Cellosolve solvents. Therefore, this polymer can be applied in alkaline developable resist materials and the like used for micro-fabrication in LSI manufacturing.

2. Method for Manufacturing Alkali-Soluble Silicon-Containing Polymer

The method for manufacturing the alkali-soluble silicon-containing polymer of the present invention is a method for manufacturing the polymer (I) represented by the general formula (1) above, and comprises performing hydrolytic co-condensation of s moles of an organosilane having a hydrolysable group represented by the general formula (2) below, t moles of an organosilane having a hydrolysable group represented by the general formula (3) below, and u moles of a silicon compound having a hydrolysable group represented by the general formula (4) below (wherein s and u are positive numbers; t is 0 or a positive number; $0 \leq t/(s+u) \leq 1$; and $0 < u/s \leq 5$).

(In the formula, $A^1$ is a phenyl group having either a hydroxyl group or an alkoxy group; $R^1$ is an alkylene group of 1-4 carbons; $M^1$ is a hydrolysable group; and m is 0 or 1.)

(In the formula, $R^2$ is an alkyl group of 1-4 carbons; and $M^2$ is a hydrolysable group.)

(In the formula, $M^3$ is a hydrolysable group.)

The hydrolysable groups $M^1$, $M^2$, and $M^3$ in general formulae (2), (3) and (4) above may each be the same or different. The hydrolysable group is not particularly limited so far as it can be hydrolyzed, however, examples thereof include a halogen atom such as chlorine atom and bromine atom, an alkoxy group such as methoxy group, ethoxy group, isopropoxy group and methoxyethoxy group, an acyloxy group such as acetoxy group, an trialkyl siloxy group such as trimethyl siloxy group and the like.

Compounds represented by the general formula (2) include 3-(3-methoxy-4 hydroxyphenyl)propyl triethoxysilane, 3-(2-methoxy-3-hydroxyphenyl)propyl triethoxysilane, 3-methoxy-4-hydroxyphenyl triethoxysilane, 2-p-(tert-butoxy)phenylethyl triethoxysilane and the like.

Compounds represented by the general formula (3) include trimethyl methoxysilane, trimethyl ethoxysilane and the like.

Compounds represented by the general formula (4) include tetraethoxysilane and the like.

Each number of mole of the organosilane having a hydrolysable group represented by the general formula (2) above, the organosilane having a hydrolysable group represented by the general formula (3) above, and the silicon compound having a hydrolysable group represented by the general formula (4) above is such that the conditions which are the same as those in the general formula (1) above, that is, specifically, s and u are positive numbers, t is 0 or a positive number, $0 \leq t/(s+u) \leq 1$ and $0 < u/s \leq 5$ are satisfied. Molecular weight, softening point, quantity of the phenyl group having a hydroxyl group or an alkoxy group, degree of alkali solubility, and the like can be freely controlled by varying the mole ratios while satisfying these conditions.

Referring to the method for hydrolytic co-condensation using three types of silicon compounds above, known methods may be applied and a catalyst is usually used. Examples of the catalyst include an acidic catalyst, a basic catalyst, a metal chelate compound and the like.

Each of an inorganic acid and an organic acid may be used alone or in combination as the acidic catalyst. Examples of the inorganic acid include hydrochloric acid, sulfuric acid, phosphoric acid, nitric acid and the like. Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzene sulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid and the like.

Each of an inorganic base and an organic base may be used alone or in combination as the basic catalyst. Examples of the inorganic base include ammonia, sodium hydroxide, potassium hydroxide and the like. Examples of the organic base include pyridine, pyrrole, piperazine, pyrrolidine, piperidine, picoline, monomethyl amine, dimethyl amine, trimethyl amine, monoethyl amine, diethyl amine, triethyl amine, monopropyl amine, dipropyl amine, tripropyl amine, monobutyl amine, dibutyl amine, tributyl amine, monoethanol amine, diethanol amine, dimethyl monoethanol amine, monomethyl diethanol amine, triethanol amine, diazabicyclo octane, diazabicyclo nonane, diazabicyclo undecane, tetramethylammonium hydroxide and the like.

Examples of the metal chelate compound include titanium chelate compounds, zirconium chelate compounds, aluminum chelate compounds and the like.

In the method for manufacturing the polymer (I) of the present invention, using an acidic catalyst is preferred and highly volatile hydrochloric acid, nitric acid and the like is particularly preferred.

The hydrolytic co-condensation mentioned above is preferably performed at a temperature in the range from 40 to 80° C. In the case the reaction temperature is lower than 40° C., the hydrolysis rate decreases, and an organopolysiloxane having an unreacted alkoxy group may be formed. In addition, the reaction time also increases and productivity tends to lower. In this hydrolytic co-condensation, it is also possible to jointly use an organic solvent including aromatic-based hydrocarbons such as benzene, toluene and xylene, alcohols such as methanol and ethanol, ketones such as acetone, esters, ethers, chlorinated hydrocarbons, and the like. In such a case, the reaction is preferably performed while the organic solvent is heated and circulated. The reaction time differs depending on the kinds of three types of organosilanes above, the reaction temperature and other conditions, but is usually in the range from 1 to 10 hours.

When $A^1$ is a hydroxyphenyl group in the organosilane having a hydrolysable group represented by the general formula (2) above, the polymer (I) of the present invention can also be obtained by performing hydrolytic co-condensation using a compound in which the hydroxyl group is protected by an alkyl group of 1-4 carbons such as methyl group, ethyl and t-butyl group; an acyl group of 1-4 carbons such as acetyl group; or a trialkylsilyl group such as trimethylsilyl group and t-butyldimethylsilyl group, where an alkyl group of 1-4 carbons is bonded to Si atom instead of the organosilane represented by the general formula (2), and de-protecting.

In the case of protecting by trialkylsilyl group, this trialkylsilyl group is hydrolyzed and can be incorporated into the silicon-containing polymer of the present invention as a monofunctional siloxane unit represented by the general formula (7).

3. Silicon-Containing Polymer

The other silicon-containing polymer (also referred to as "polymer (II)") of the present invention is represented by the general formula (5) below and has a weight-average molecular weight in the range from 500 to 500,000:

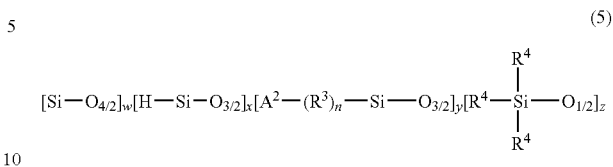

(In the formula, A is an organic group of 2-10 carbons, having a carbon-carbon unsaturated group; $R^3$ is an alkylene group of 1-20 carbons, a bivalent aromatic group of 6-20 carbons, or a bivalent alicyclic group of 3-20 carbons; n is 0 or 1; $R^4$ is a hydrogen atom or an alkyl group of 2-10 carbons ($R^4$ in one molecule may be the same type or a combination of two or more different types.); each of x and y is a positive number; each of w and z is 0 or a positive number; $0 \leq z/(w+x+y) \leq 2$; and $0.01 \leq y/(w+x) \leq 5$).

The silicon-containing polymer (II) of the present invention comprises, as represented by the general formula (5) above, a tetrafunctional siloxane unit represented by the formula (9) below, a trifunctional siloxane unit represented by the formula (10) below, a trifunctional siloxane unit represented by the formula (11) below and a monofunctional siloxane unit represented by the formula (12) below. These units may each be bonded with any same or different siloxane unit. The silicon-containing polymer (II) of the present invention does not necessarily comprise the tetrafunctional siloxane unit represented by the formula (9) below and the monofunctional siloxane unit represented by the general formula (12) below.

(In the formula, A is an organic group of 2-10 carbons, having a carbon-carbon unsaturated group; $R^3$ is an alkylene group of 1-20 carbons, a bivalent aromatic group of 6-20 carbons, or a bivalent alicyclic group of 3-20 carbons; n is 0 or 1.)

(In the formula, $R^4$ is a hydrogen atom or an alkyl group of 1-10 carbons.)

In the general formula (5) above, $A^2$ is an organic group of 2-10 carbons, having a carbon-carbon unsaturated group, and is preferably a functional group having a carbon-carbon double bond or a triple bond.

Preferred examples of $A^2$ include vinyl group, o-styryl group, m-styryl group, p-styryl group, acryloyl group, methacryloyl group, acryloxy group, methacryloxy group, 1-propenyl group, 1-butenyl group, 1-pentenyl group, 3-methyl-1-butenyl group, phenyl ethenyl group, ethynyl group, 1-propynyl group, 1-butynyl group, 1-pentynyl group, 3-methyl-1-butynyl group, phenyl butynyl group and the like.

In the general formula (5) above, $A^2$ in one molecule may be the same type or a combination of two or more different types when $y \geq 2$.

In general formulae (5) and (11) above, $R^3$ is an alkylene group of 1-20 carbons, a bivalent aromatic group of 6-20 carbons, or a bivalent alicyclic group of 3-20 carbons.

The alkylene group of 1-20 carbons is preferably methylene group, ethylene group, n-propylene group, i-propylene group, n-butylene group, i-butylene group and the like.

The bivalent aromatic group of 6-20 carbons is preferably phenylene group, naphthylene group and the like.

The bivalent alicyclic group of 3-20 carbons is preferably a bivalent hydrocarbon group having a norbornene backbone, a tricyclodecane backbone, an adamantine backbone, or the like.

Also in the formulae above, n is 0 or 1.

In general formulae (5) and (12) above, $R^4$ is a hydrogen atom or an alkyl group of 1-10 carbons. Preferred examples of $R^4$ include methyl group, ethyl group, n-propyl group, i-propyl group, n-butyl group and i-butyl group and the like.

$R^4$ contained in the polymer (II) of the present invention may be the same type or a combination of two or more different types.

In the general formula (5) above, each of x and y is a positive number, each of w and z is 0 or a positive number, $0 \leq z/(w+x+y) \leq 2$ and $0.01 \leq y/(w+x) \leq 5$). When w=0, preferred is $0.2 \leq y/x \leq 5$, and when $w \geq 1$, preferred is $0.01 \leq y/(w+x) \leq 2$. In the case of being out of these ranges, syntheses are difficult and a cured material having high heat resistance can not be obtained.

The polymer (II) of the present invention may comprise some hydroxyl groups, alkoxy groups, halogen atoms and the like that are remained in the manufacturing process.

The weight-average molecular weight (Mw) of the silicon-containing polymer (II) of the present invention is in the range from 500 to 500,000 as measured by GPC using standard polystyrene. In the case of being out of these ranges, syntheses are difficult.

The silicon-containing polymer (II) of the present invention can be obtained by performing hydrolytic co-condensation of w moles of a silicon compound having a hydrolysable group represented by the general formula (13) below, x moles of a silicon compound having a hydrolysable group represented by the general formula (14) below, y moles of an organosilane having a hydrolysable group represented by the general formula (15) below, and z moles of an organosilane having a hydrolysable group represented by the general formula (16) below.

$$SiM^4_4 \quad (13)$$

(In the formula, $M^4$ is a hydrolysable group.)

$$HSiM^5_3 \quad (14)$$

(In the formula, $M^5$ is a hydrolysable group.)

$$A^2(R^3)_n SiM^6_3 \quad (15)$$

(In the formula, $A^2$ is an organic group of 2-10 carbons, having a carbon-carbon unsaturated group, $R^3$ is an alkylene group of 1-20 carbons, a bivalent aromatic group of 6-20 carbons, or a bivalent alicyclic group of 3-20 carbons and $M^6$ is a hydrolysable group.)

(16)

(In the formula, $R^4$ is a hydrogen atom or an alkyl group of 1-10 carbons ($R^4$ in this unit may be the same type or a combination of two or more different types.), and $M^7$ is a hydrolysable group.)

The hydrolysable groups $M^4$, $M^5$, $M^6$, and $M^7$ in general formulae (13), (14), (15) and (16) above may each be the same or different. The hydrolysable group includes a halogen atom such as chlorine atom and bromine atom; an alkoxy group such as methoxy group, ethoxy group, isopropoxy group and methoxyethoxy group; an acyloxy group such as acetoxy group; a trialkylsiloxy group such as trimethylsiloxy group; and the like.

When the silicon compound having a hydrolysable group represented by the general formula (13) above, the silicon compound having a hydrolysable group represented by the general formula (14) above, the organosilane having a hydrolysable group represented by the general formula (15) above, and the organosilane having a hydrolysable group represented by the general formula (16) above, it is preferable that each number of mole of them is such that the conditions which are the same as those in the general formula (5) above, that is, specifically, each of x and y is positive number, each of w and z is 0 or a positive number, $0 \leq z/(w+x+y) \leq 2$ and $0.01 \leq y/(w+x) \leq 5$ are satisfied. When w=0, $0.2 \leq y/x \leq 5$ is preferred. And when $w \geq 1$, $0.01 \leq y/(w+x) \leq 2$ is preferred. Molecular weight, viscosity of the resin, heat resistance and the like can be freely controlled by varying the mole ratios while satisfying these conditions.

In the hydrolytic co-condensation using each of the compound above, 0.5×z moles of the hydrolysable organosilane represented by the general formula (17) below may be used instead of z moles of the organosilane having a hydrolysable group represented by the general formula (16) above.

(17)

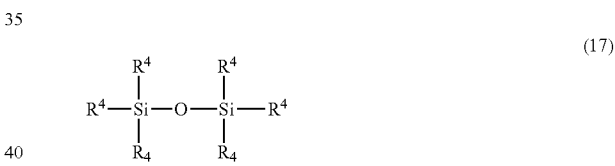

(In the formula, $R^4$ is a hydrogen atom or an alkyl group of 1-10 carbons ($R^4$ in one molecule may be the same type or a combination of two or more different types.).)

Referring to the method for hydrolytic co-condensation using each of the compound above, known methods may be applied. And the method described as the method for manufacturing the silicon-containing polymer (I) above may be used.

4. Heat-Resistant Resin Composition

The heat-resistant resin composition of the present invention comprises a hydrosilylated polymer obtained by a reaction between a hydrogen atom bonded to a silicon atom in the silicon-containing polymer (II) above, and a carbon-carbon unsaturated group in another silicon-containing polymer (II) above.

The reaction for obtaining the hydrosilylated polymer above is referred to as "hydrosilylation" and a catalyst may or may not be used.

When a catalyst is used, a platinum-containing catalyst is preferred.

As the platinum-containing catalyst, one that is conventionally used for hydrosilylation may be used, and examples thereof include platinum divinylsiloxane, platinum cyclic vinylmethylsiloxane, tris(dibenzylidene acetone)diplatinum, chloroplatinic acid, bis(ethylene)tetrachlorodiplatinum, cyclooctadiene dichloroplatinum, bis(cyclooctadiene)platinum, bis(dimethylphenylphosphine)dichloroplatinum, tetrakis(triphenylphosphine)platinum, platinum carbon and the like.

Hydrosilylation progresses in a reaction system regardless of the presence of a solvent. When a solvent is used, various solvents in conventional use may be used, including hydrocarbons, aromatic-based hydrocarbons, chlorinated hydrocarbons, alcohols, ethers, amides, ketones, esters, Cellosolves and the like.

Hydrosilylation can be performed at various temperatures, and a temperature range of 40° C. or higher and less than 200° C. is particularly preferred.

Since the heat-resistant resin composition of the present invention is excellent in heat resistance in block-like, film-like, or any other form, its original form can be maintained even in a temperature range from 300 to 1,000° C., for example, without undergoing decomposition, degradation or the like. Particularly, a weight loss rate when the temperature is increased from 25° C. to 1,000° C. at a rate of temperature increase of 10° C./minute in nitrogen atmosphere can be kept to preferably 5% or less. In addition, a weight loss rate when the temperature is increased from 25° C. to 1,000° C. at a rate of temperature increase of 10° C./minute in oxygen atmosphere can also be kept to preferably 8% or less.

5. Heat-Resistant Film

The heat-resistant film of the present invention is one by spreading an organic solvent solution of the silicon-containing polymer (II) above on a substrate and curing the coated film by thermal hydrosilylation.

The organic solvent used for the organic solvent solution above is not particularly limited so far as it is capable of dissolving the silicon-containing polymer (II). And the solvent such as hydrocarbon, aromatic-based hydrocarbons, chlorinated hydrocarbons, alcohols, ethers, amides, ketones, esters, Cellosolves and the like may be used.

The substrate is not particularly limited so far as it is composed of a material whereby a film can be obtained by coating or the like, such as an inorganic material, an organic material, and a combination of these materials. Preferred material includes metals, alloys, ceramics, wood, plastics and the like.

A shape of the substrate may be a sheet, a plate, an angled body, a pipe, a disc, a sphere or the like, and may be a combination of these shapes.

Therefore, specific examples of the substrate include a plate-like glass, silicon wafer, plastic moldings in various shapes, construction materials, a metal plate and the like.

A method for coating the organic solvent solution containing the silicon-containing polymer above on the substrate includes casting method, spin coating method, bar coating method, spraying method and the like.

When the film is formed, the organic solvent solution containing the silicon-containing polymer above is usually spread on the substrate in an inert gas atmosphere such as air and nitrogen to a coated film, and the film is heat treated for an appropriate period of time; specifically, 1 minute to 10 hours, and preferably 1 minute to 1 hour. By this heating, the organic solvent is dried and evaporated, and a film is formed. The temperature of this heat treatment is usually in the range of 40° C. or higher and less than 300° C., however, a range from 50° C. to 200° C. is preferred. This heat treatment may be performed at the same temperature within this range, or in combination of rising temperature and falling temperature.

In addition, the obtained film is heat treated at a high temperature in the range from 100° C. to 1,500° C. in an inert gas atmosphere such as nitrogen gas for one minute or longer to a heat-resistant cured film. According to the heat treatment at the temperature range above, curing by thermal hydrosilylation between Si—H and C=C (or C≡C) in the film can be proceeded. A preferable temperature is in the range from 150° C. to 1,000° C., and more preferable is a range from 300° C. to 1,000° C.

The heat-resistant film of the present invention has a good characterization in mechanical strength such as heat resistance, water resistance, chemical resistance, stability, electrical insulation properties and excoriation resistance that are exhibited by a silsesquioxane-based polymer. Therefore, this film can be used in films, layers and the like for products and parts in wide fields including electronics, optical functional materials and the like. For example, this film can be used for semiconductor materials such as a passivation film, a resist film and an interlayer dielectric film, aerospace materials and the like. And the film can be used for various types of protective films.

EXAMPLES

The present invention is described in detail using examples. In the examples, "Me" refers to methyl group.

1. Manufacture of Alkali-Soluble Silicon-Containing Polymer

Reference Example 1 [Synthesis of 3-(3-methoxy-4-hydroxyphenyl)propyl triethoxysilane]

Into a four-neck flask provided with a stirrer, a reflux condenser, a dropping funnel and a thermometer were added 164 g (1.0 mole) of 3-(3-methoxy-4-hydroxyphenyl)propene and 100 ppm in terms of platinum metal of a 2 mass % isopropanol solution of chloroplatinic acid. Then 164 g (1.0 mole) of triethoxysilane was dripped over the course of five hours from a dropping funnel and was reacted while the mixture was heated and stirred at a temperature in the range from 50 to 60° C. After the reaction was completed, vacuum distillation was performed and 289 g (0.88 mole) of the desired product (3-(3-methoxy-4-hydroxyphenyl)propyl triethoxysilane) were obtained. The yield was 88%.

The physical properties of the reaction product were as follows.

Boiling point: 130° C. at 2 mmHg $^1$H-NMR δ (ppm): 0.6 to 0.8 (m, 2H), 1.1 to 1.3 (m, 9H), 1.6 to 1.9 (m, 2H), 2.4 to 2.6 (m, 2H), 3.5 to 4.1 (m, 9H), 5.48 (s, 1H), 6.5 to 6.7 (m, 2H), 6.7 to 7.0 (m, 1H)

Example 1-1

Into a four-neck flask provided with a stirrer, a reflux condenser, a dropping funnel and a thermometer were added 65.7 g (0.2 mole) of 3-(3-methoxy-4-hydroxyphenyl)propyl triethoxysilane obtained in Reference Example 1 above, 33.3 g (0.16 mole) of tetraethoxysilane, 3.2 g (0.02 mole) of hexamethyldisiloxane, and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C.

After dripping was completed, circulation was continued for four hours at 75° C. Subsequently water was added in the amount of 150 g to the reaction system, and the product was separated into two layers by allowing the mixture to stand. The bottom layer containing a polymer component was divided, and the top layer was extracted using 100 g of toluene. Then the toluene extract and the polymer component above were combined and returned to a flask equipped with a receptacle for measuring water content, and the water and ethanol were evaporated by azeotropy. The product was cooled, filtered and concentrated, and 47.8 g of a silicon-containing polymer were obtained. The yield was 85%.

The physical properties of the silicon-containing polymer above were as follows, and the product was confirmed to be the silicon-containing polymer represented by the formula (18) below.

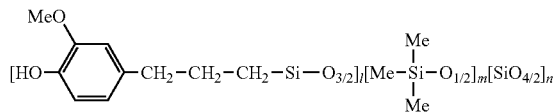

(18)

(In the formula, l:m:n=1:0.2:0.8.)

Molecular weight (GPC, tetrahydrofuran solvent, determined by using polystyrene as the standard):

$Mw=8.5 \times 10^3$ $Mn=4.4 \times 10^3$

Softening point: 95 to 100° C.

$^1$H-NMR δ (ppm): −0.4 to 0.4 (br, 1.8H), 0.5 to 2.7 (br, 6H), 3.4 to 4.3 (br, 3H), 6.4 to 7.2 (br, 3H)

$^{29}$Si-NMR δ (ppm): −114 to −102 (br, 0.79Si), −70 to −63 (br, 1Si), 8 to 15 (br, 0.18Si)

Examples 1-2 Through 1-5

The 3-(2-methoxy-3-hydroxyphenyl)propyl triethoxysilane obtained in Reference Example 1 above was charged together with tetraethoxysilane, hexamethyldisiloxane or the like in the ratios shown in Table 1 to produce silicon-containing polymers in the same manner as in Example 1-1. The physical properties of the reaction products were shown together in Table 1.

TABLE 1

| Silicon-containing polymer | Charged mole ratio A:B:C | l:m:n in chemical formula (18) | Weight-average molecular weight Mw | Softening point (° C.) |
|---|---|---|---|---|
| Example 1-1 | 1:0.1:0.8 | 1:0.2:0.8 | $8.5 \times 10^3$ | 95~100 |
| Example 1-2 | 1:0.2:0.6 | 1:0.4:0.6 | $4.2 \times 10^3$ | 75~80 |
| Example 1-3 | 1:0.01:0.48 | 1:0.02:0.48 | $1.1 \times 10^5$ | 150~160 |
| Example 1-4 | 1:0:1 | 1:0:1 | $4.5 \times 10^5$ | 190~200 |
| Example 1-5 | 1:0:0 | 1:0:0 | $2.5 \times 10^3$ | 45~50 |

A; 3-(2-methoxy-3-hydroxyphenyl)propyl triethoxysilane
B; hexamethyldisiloxane
C; tetraethoxysilane The silicon-containing polymers which were obtained in Examples 1-1 through 1-5 were dissolved in an aqueous solution of sodium hydroxide, an aqueous solution of tetramethylammonium hydroxide, methanol, tetrahydrofuran, dimethyl formamide, methylisobutylketone and isoamyl acetate, but were hardly soluble in hexane, carbon tetrachloride, chloroform, toluene and the like.

Reference Example 2 (Synthesis of 2-p-(tert-butoxy)phenylethyl triethoxysilane)

Into a four-neck flask provided with a stirrer, a reflux condenser, a dropping funnel and a thermometer were added 176 g (1.0 mole) of p-(tert-butoxy)styrene and 100 ppm in terms of platinum metal of a 2 mass % isopropanol solution of chloroplatinic acid. Then 164 g (1.0 mole) of triethoxysilane was dripped over the course of five hours from the dropping funnel and was reacted while the mixture was heated and stirred at a temperature in the range from 50 to 60° C. After the reaction was completed, vacuum distillation was performed and 313 g (0.92 mole) of the desired product (2-p-(tert-butoxy)phenylethyl triethoxysilane) were obtained. The yield was 92%.

The physical properties of the reaction product were as follows.

Boiling point: 115° C. at 3 mmHg $^1$H-NMR δ (ppm): 0.5 to 0.7 (m, 2H), 1.0 to 1.5 (m, 18H), 2.4 to 2.7 (m, 2H), 3.5 to 4.1 (m, 6H), 6.5 to 6.7 (m, 2H), 6.7 to 7.0 (m, 2H)

Example 1-6

Into a four-neck flask provided with a stirrer, a reflux condenser, a dropping funnel and a thermometer were added 68.1 g (0.2 mole) of the 2-p-(tert-butoxy)phenylethyl triethoxysilane obtained in Reference Example 2, 33.3 g (0.16 mole) of tetraethoxysilane, 3.2 g (0.02 mole) of hexamethyldisiloxane and 41.5 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 1-1 to obtain 51.7 g of a silicon-containing polymer. The yield was 88%.

The physical properties of the silicon-containing polymer above were as follows, and the product was confirmed to be the silicon-containing polymer represented by the formula (19) below.

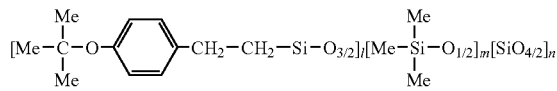

(19)

(In the formula, l:m:n=1:0.2:0.8.)

Molecular weight (GPC, tetrahydrofuran solvent, determined by using polystyrene as the standard):

$Mw=5.6 \times 10^3$ $Mn=3.2 \times 10^3$

Softening point: 120 to 130° C.

$^1$H-NMR δ (ppm): −0.4 to 0.4 (br, 1.8H), 0.5 to 2.7 (br, 13H), 6.4 to 7.2 (br, 4H)

$^{29}$Si-NMR δ (ppm): −113 to −101 (br, 0.78Si), −72 to −64 (br, 1Si), 7 to 15 (br, 0.15Si)

The silicon-containing polymer which was obtained in Example 1-6 was dissolved in an inorganic-based aqueous solution such as the aqueous solution of sodium hydroxide above and the aqueous solution of tetramethylammonium hydroxide above, an organic solvent such as methanol, ethanol, tetrahydrofuran, toluene, dimethyl formamide, methylisobutylketone, isoamyl acetate, hexane and carbon tetrachloride.

2. Manufacture of Silicon-Containing Polymer

Example 2-1

Into a four-neck flask provided with a stirrer, a reflux condenser, a dropping funnel and a thermometer were added 24.7 g (0.15 mole) of triethoxysilane, 22.2 g (0.15 mole) of vinyltrimethoxysilane, 2.4 g (0.015 mole) of hexamethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C.

After dripping was completed, circulation was continued for four hours at 75° C. Subsequently water was added in the amount of 150 g to the reaction system, and the product was separated into two layers by allowing the mixture to stand. The bottom layer containing a polymer component was divided, and the top layer was extracted using 100 g of toluene. Then the toluene extract and the polymer component above were combined and returned to a flask equipped with a receptacle for measuring water content, and the water and ethanol were evaporated by azeotropy. The product was cooled, filtered and concentrated, and 19.0 g of a silicon-containing polymer (P1) were obtained. The yield was 85%.

The physical properties of silicon-containing polymer (P1) above were as follows, and the product was confirmed to be the silicon-containing polymer represented by the formula (20) below (see Table 2).

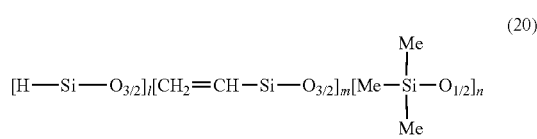

(20)

(In the formula, l:m:n=1:1:0.2.)

Molecular weight (GPC, tetrahydrofuran solvent, determined by using polystyrene as the standard):

Mw=2.0×10$^3$
Mn=1.0×10$^3$
Viscosity (25° C.): 1.2×10$^0$ Pa·s
$^1$H-NMR δ (ppm): −0.4 to 0.4 (br, 1.8H), 4.2 to 5.0 (br, 1H), 5.4 to 6.2 (br, 3H)
$^{29}$Si-NMR δ (ppm): −89 to −82 (br, 1Si), −70 to −63 (br, 0.99Si), 8 to 15 (br, 0.19Si)

Examples 2-2 Through 2-5

Tetraethoxysilane, vinyltrimethoxysilane and hexamethyldisiloxane were charged in the ratios shown in Table 2 to produce silicon-containing polymers (P2) through (P5) in the same manner as in Example 2-1. The physical properties of the reaction products were shown together in Table 2.

TABLE 2

|  |  | Silicon-containing polymer | Charged mole ratio D:E:F | l:m:n in chemical formula (20) | Weight-average molecular weight Mw | Viscosity (25° C.) (Pa·s) |
|---|---|---|---|---|---|---|
| Example | 2-1 | (P1) | 1:1:0.1 | 1:1:0.2 | 2.0 × 10$^3$ | 1.2 × 10$^0$ |
|  | 2-2 | (P2) | 1:1:0.05 | 1:1:0.1 | 6.2 × 10$^3$ | 7.3 × 10$^0$ |
|  | 2-3 | (P3) | 1:1:0.02 | 1:1:0.04 | 2.3 × 10$^4$ | 4.5 × 10$^1$ |
|  | 2-4 | (P4) | 0.2:1.8:0.1 | 0.2:1.8:0.2 | 1.9 × 10$^3$ | 1.0 × 10$^0$ |
|  | 2-5 | (P5) | 1.8:0.2:0.1 | 1.8:0.2:0.2 | 2.2 × 10$^3$ | 1.4 × 10$^0$ |

D; triethoxysilane
E; vinyltrimethoxysilane
F; hexamethyldisiloxane

The silicon-containing polymers (P1) through (P5) which were obtained in Examples 2-1 through 2-5 were all dissolved in an organic solvent such as methanol, ethanol, tetrahydrofuran, toluene, dimethyl formamide, methylisobutylketone, isoamyl acetate, hexane and carbon tetrachloride.

Example 2-6

Into a four-neck flask provided with a stirrer, a reflux condenser, a dropping funnel and a thermometer were added 24.7 g (0.15 mole) of triethoxysilane, 22.2 g (0.15 mole) of vinyltrimethoxysilane, 2.0 g (0.015 mole) of 1,1,3,3-tetramethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 2-1 to obtain 19.2 g of silicon-containing polymer (P6). The yield was 88%.

The physical properties of silicon-containing polymer (P6) above were as follows, and the product was confirmed to be the silicon-containing polymer represented by the formula (21) below.

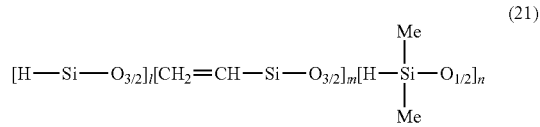

(21)

(In the formula, l:m:n=1:1:0.2.)

Molecular weight (GPC, tetrahydrofuran solvent, determined by using polystyrene as the standard):

Mw=2.2×10$^3$
Mn=1.2×10$^3$
Viscosity (25° C.): 1.1×10$^0$ Pa·s
$^1$H-NMR δ (ppm): −0.4 to 0.4 (br, 1.2H), 4.2 to 5.0 (br, 1.2H), 5.4 to 6.2 (br, 3H)
$^{29}$Si-NMR δ (ppm): −89 to −82 (br, 1Si), −70 to −63 (br, 0.98Si), −12 to −5 (br, 0.2Si)

The silicon-containing polymer (P6) which was obtained in Example 2-6 was dissolved in an organic solvent such as methanol, ethanol, tetrahydrofuran, toluene, dimethyl formamide, methylisobutylketone, isoamyl acetate, hexane and carbon tetrachloride.

Example 2-7

Into a four-neck flask provided with a stirrer, a reflux condenser, a dropping funnel and a thermometer were added 24.7 g (0.15 mole) of triethoxysilane, 33.7 g (0.15 mole) of p-styryl trimethoxysilane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 2-1 to obtain 27.8 g of silicon-containing polymer (P7). The yield was 89%.

The physical properties of silicon-containing polymer (P7) above were as follows, and the product was confirmed to be the silicon-containing polymer represented by the formula (22) below.

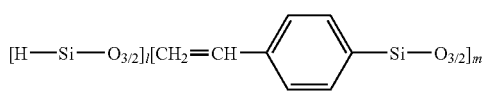

(22)

(In the formula, l:m=1:1.)
Molecular weight (GPC, tetrahydrofuran solvent, determined by using polystyrene as the standard):
Mw=6.2×10$^3$
Mn=3.2×10$^3$
Viscosity (25° C.): 5.2×10$^1$ Pa·s
$^1$H-NMR δ (ppm): 4.2 to 5.0 (br, 1H), 5.3 to 6.8 (br, 3H), 7.1 to 7.8 (br, 4H)
$^{29}$Si-NMR δ (ppm): −89 to −82 (br, 1Si), −70 to −63 (br, 0.99Si)

The silicon-containing polymer (P7) which was obtained in Example 2-7 was dissolved in an organic solvent such as methanol, ethanol, tetrahydrofuran, toluene, dimethyl formamide, methylisobutylketone, isoamyl acetate, hexane and carbon tetrachloride.

Example 2-8

Into a four-neck flask provided with a stirrer, a reflux condenser, a dropping funnel and a thermometer were added 24.7 g (0.15 mole) of triethoxysilane, 33.7 g (0.15 mole) of p-styryl trimethoxysilane, 2.4 g (0.015 mole) of hexamethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 2-1 to obtain 28.3 g of silicon-containing polymer (P8). The yield was 84%.

The physical properties of silicon-containing polymer (P8) above were as follows, and the product was confirmed to be the silicon-containing polymer represented by the formula (23) below.

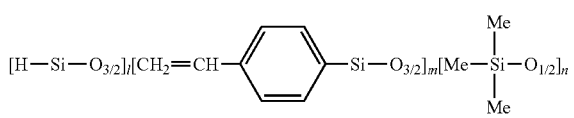

(23)

(In the formula, l:m:n=1:1:0.2.)
Molecular weight (GPC, tetrahydrofuran solvent, determined by using polystyrene as the standard):
Mw=2.3×10$^3$
Mn=1.4×10$^3$
Viscosity (25° C.): 3.8×10$^0$ Pa·s
$^1$H-NMR δ (ppm): −0.4 to 0.4 (br, 1.8H), 4.2 to 5.0 (br, 1H), 5.3 to 6.8 (br, 3H), 7.1 to 7.8 (br, 4H)
$^{29}$Si-NMR δ (ppm): −89 to −82 (br, 1Si), −70 to −63 (br, 1Si), 8 to 15 (br, 0.2Si)

The silicon-containing polymer (P8) which was obtained in Example 2-8 was dissolved in an organic solvent such as methanol, ethanol, tetrahydrofuran, toluene, dimethyl formamide, methylisobutylketone, isoamyl acetate, hexane and carbon tetrachloride.

Example 2-9

Into a four-neck flask provided with a stirrer, a reflux condenser, a dropping funnel and a thermometer were added 24.7 g (0.15 mole) of triethoxysilane, 33.7 g (0.15 mole) of p-styryl trimethoxysilane, 2.0 g (0.015 mole) of 1,1,3,3-tetramethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 2-1 to obtain 27.6 g of silicon-containing polymer (P9). The yield was 83%.

The physical properties of silicon-containing polymer (P9) above were as follows, and the product was confirmed to be the silicon-containing polymer represented by the formula (24) below.

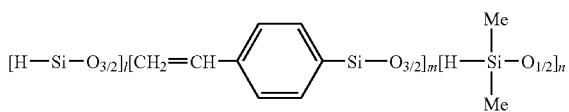

(24)

(In the formula, l:m:n=1:1:0.2.)
Molecular weight (GPC, tetrahydrofuran solvent, determined by using polystyrene as the standard):
Mw=2.2×10$^3$
Mn=1.2×10$^3$
Viscosity (25° C.): 4.1×10$^0$ Pa·s
$^1$H-NMR δ (ppm): −0.4 to 0.4 (br, 1.2H), 4.2 to 5.0 (br, 1.2H), 5.3 to 6.8 (br, 3H), 7.1 to 7.8 (br, 4H)
$^{29}$Si-NMR δ (ppm): −89 to −82 (br, 1Si), −70 to −63 (br, 0.99Si), −12 to −5 (br, 0.19Si)

The silicon-containing polymer (P9) which was obtained in Example 2-9 was dissolved in an organic solvent such as methanol, ethanol, tetrahydrofuran, toluene, dimethyl formamide, methylisobutylketone, isoamyl acetate, hexane and carbon tetrachloride.

Example 2-10

Into a four-neck flask provided with a stirrer, a reflux condenser, a dropping funnel and a thermometer were added 24.7 g (0.15 mole) of triethoxysilane, 37.7 g (0.15 mole) of 3-methacryloxypropyl trimethoxysilane, 2.4 g (0.015 mole) of hexamethyl disiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 2-1 to obtain 34.3 g of silicon-containing polymer (P10). The yield was 92%.

The physical properties of silicon-containing polymer (P10) above were as follows, and the product was confirmed to be the silicon-containing polymer represented by the formula (25) below.

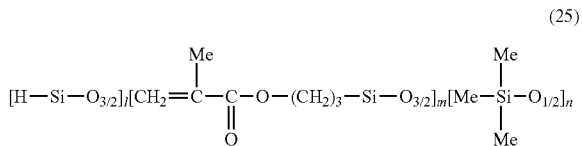

(25)

(In the formula, l:m:n=1:1:0.2.)

Molecular weight (GPC, tetrahydrofuran solvent, determined by using polystyrene as the standard):
Mw=2.4×10$^3$
Mn=1.5×10$^3$
Viscosity (25° C.): 3.2×10$^0$ Pa·s
$^1$H-NMR δ (ppm): −0.4 to 0.4 (br, 1.8H), 0.5 to 1.0 (br, 2H), 1.5 to 2.5 (br, 5H), 3.6 to 4.2 (br, 2H), 4.3 to 5.0 (br, 1H), 5.7 to 7.1 (br, 2H) $^{29}$Si-NMR δ (ppm): −89 to −82 (br, 1Si), −70 to −63 (br, 0.99Si), 8 to 15 (br, 0.2Si)

The silicon-containing polymer (P10) which was obtained in Example 2-10 was dissolved in methanol, ethanol, tetrahydrofuran, dimethyl formamide, methylisobutylketone and isoamyl acetate, but was hardly soluble in hexane, carbon tetrachloride, chloroform, toluene and the like.

Example 2-11

Into a four-neck flask provided with a stirrer, a reflux condenser, a dropping funnel and a thermometer were added 24.7 g (0.15 mole) of triethoxysilane, 35.2 g (0.15 mol) of 3-acryloxypropyl trimethoxysilane, 2.4 g (0.015 mole) of hexamethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that separation and concentration were conducted in the same manner as in Example 2-1 to obtain 31.7 g of silicon-containing polymer (P11). The yield was 90%.

The physical properties of silicon-containing polymer (P11) above were as follows, and the product was confirmed to be the silicon-containing polymer represented by the formula (26) below.

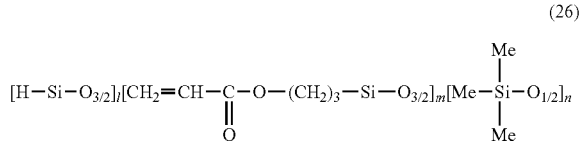

(26)

(In the formula, l:m:n=1:1:0.2.)

Molecular weight (GPC, tetrahydrofuran solvent, determined by using polystyrene as the standard):
Mw=2.3×10$^3$
Mn=1.1×10$^3$
Viscosity (25° C.): 3.2×10$^0$ Pas
$^1$H-NMR δ (ppm): −0.4 to 0.4 (br, 1.8H), 0.5 to 1.0 (br, 2H), 1.9 to 2.5 (br, 2H), 3.6 to 4.2 (br, 2H), 4.3 to 5.0 (br, 1H), 5.7 to 7.1 (br, 3H)
$^{29}$Si-NMR δ (ppm): −89 to −82 (br, 1Si), −70 to −63 (br, 0.98Si), 8 to 15 (br, 0.2Si)

The silicon-containing polymer (P11) which was obtained in Example 2-11 was dissolved in methanol, ethanol, tetrahydrofuran, dimethyl formamide, methylisobutylketone and isoamyl acetate, but was hardly soluble in hexane, carbon tetrachloride, chloroform, toluene and the like.

3. Preparation and Evaluation of Heat-Resistant Resin Composition

Example 2-12

Ten grams of silicon-containing polymer (P1) obtained in Example 2-1 and 1 mg of chloroplatinic acid were stirred for five minutes at room temperature to mix, and then were heated for one hour at a temperature of 120° C. Thereby an insoluble, infusible resin composition was obtained. During this heating, there was no vaporization of a compound having an unsaturated group.

This resin composition was analyzed by thermogravimetry. And when the composition was heated from 25° C. at a rate of temperature increase of 10° C./minute in nitrogen atmosphere, the weight loss rate at 625° C. was 5.0%. In addition, When the composition was heated in air atmosphere under the same conditions, 84.3% thereof remained, and Td5 (the temperature at which the weight loss rate became 5 mass % using the mass of the composition before heating as a reference) was 405° C. (see Table 3). Further, according to differential scanning calorimetry (DSC), behavior considered to be glass transition point was not clearly confirmed in a temperature range up to 500° C.

Examples 2-13 Through 2-16

Resin compositions were prepared using silicon-containing polymers (P2) through (P5) obtained in Examples 2-2 through 2-5, and were evaluated in the same manner as in Example 2-12. The results thereof are shown in Table 3.

TABLE 3

| | | Silicon-containing polymer | Property (after heating for 1 hour at 120° C.) | Td5 in nitrogen atmosphere (° C.) | Td5 in air atmosphere (° C.) |
|---|---|---|---|---|---|
| Example | 2-12 | (P1) | Insoluble and infusible | 625 | 405 |
| | 2-13 | (P2) | Insoluble and infusible | 820 | 615 |
| | 2-14 | (P3) | Insoluble and infusible | 855 | 650 |
| | 2-15 | (P4) | Soluble in toluene | 355 | 260 |
| | 2-16 | (P5) | Soluble in toluene | 385 | 275 |

Example 2-17

Ten grams of silicon-containing polymer (P6) obtained in Example 2-6 and 1 mg of chloroplatinic acid were stirred for five minutes at room temperature to mix, and then were heated for one hour at a temperature of 120° C. Thereby an insoluble, infusible resin composition was obtained. During this heating, there was no vaporization of a compound having an unsaturated group.

This resin composition was analyzed by thermogravimetry. And when the composition was heated from 25° C. at a rate of temperature increase of 10° C./minute in nitrogen atmosphere, the weight loss rate at 1065° C. was 5.0%. In addition, When the composition was heated in air atmosphere under the same conditions, 90.2% thereof remained, and Td5 was 620° C. (see Table 3). Further, behavior considered to be glass transition was not clearly confirmed in a temperature range up to 500° C.

Examples 2-18 Through 2-22

Resin compositions were prepared using silicon-containing polymers (P7) through (P11) obtained in Examples 2-7 through 2-11, and were evaluated in the same manner as in Example 2-17. The results thereof were shown in Table 4.

TABLE 4

| | | Silicon-containing polymer | Property (after heating for 1 hour at 120° C.) | Td5 in nitrogen atmosphere (° C.) | Td5 in air atmosphere (° C.) |
|---|---|---|---|---|---|
| Example | 2-17 | (P6) | Insoluble and infusible | 1065 | 620 |
| | 2-18 | (P7) | Insoluble and infusible | 962 | 630 |
| | 2-19 | (P8) | Insoluble and infusible | 595 | 390 |
| | 2-20 | (P9) | Insoluble and infusible | 1025 | 675 |
| | 2-21 | (P10) | Insoluble and infusible | 450 | 320 |
| | 2-22 | (P11) | Insoluble and infusible | 510 | 340 |

4. Manufacture and Evaluation of Heat-Resistant Film

Example 2-23

0.9 g of tetrahydrofuran was added to 0.1 g of silicon-containing polymer (P1) obtained in Example 2-1 to prepare a resin solution.

After that, this resin solution was applied to a silicon wafer having a diameter of 3 inches by spin coating for 30 seconds at a speed of 1,000 rpm. Subsequently, the coated product was immediately heated at 110° C. for 10 minutes, and a film having a thickness of 0.5 μm was obtained. This film was smooth and free of cracks. In addition, when the film thus obtained was heated under conditions of 400° C. for 30 minutes and 700° C. for 30 minutes, there was no cracking (see Table 5). In the column showing the condition of the film in Table 5, "◯" indicates instances in which there was no cracking, and x indicates instances in which cracking occurred.

Examples 2-24 Through 2-27

Films were formed on silicon wafers using silicon-containing polymers (P2) through (P5) obtained in Examples 2-2 through 2-5 in the same manner as in Example 2-23, and the same evaluation was performed. The results thereof were shown in Table 5.

TABLE 5

| | | Silicon-containing polymer | Thickness of film | Condition of film | | |
|---|---|---|---|---|---|---|
| | | | | after heating for 10 minutes at 110° C. | after heating for 30 minutes at 400° C. | after heating for 30 minutes at 700° C. |
| Example | 2-23 | (P1) | 0.5 μm | ◯ | ◯ | ◯ |
| | 2-24 | (P2) | 0.7 μm | ◯ | ◯ | ◯ |
| | 2-25 | (P3) | 1.0 μm | ◯ | ◯ | ◯ |
| | 2-26 | (P4) | 0.5 μm | ◯ | X | X |
| | 2-27 | (P5) | 0.5 μm | ◯ | X | X |

Example 2-28

0.9 g of tetrahydrofuran was added to 0.1 g of silicon-containing polymer (P6) obtained in Example 2-6 to prepare a resin solution.

After that, this resin solution was applied to a silicon wafer having a diameter of 3 inches by spin coating for 30 seconds at a speed of 1,000 rpm. Subsequently, the coated product was immediately heated at 110° C. for 10 minutes, and a film having a thickness of 0.6 μm was obtained. This film was smooth and free of cracks. In addition, when the film thus obtained was heated under conditions of 400° C. for 30 minutes and 700° C. for 30 minutes, there was no cracking (see Table 6).

Examples 2-29 Through 2-31

Films were formed on silicon wafers using silicon-containing polymers (P7) through (P9) obtained in Examples 2-7 through 2-9 in the same manner as in Example 2-28, and the same evaluation was performed. The results thereof were shown in Table 6.

TABLE 6

| | | Silicon-containing polymer | Thickness of film | Condition of film | | |
|---|---|---|---|---|---|---|
| | | | | after heating for 10 minutes at 110° C. | after heating for 30 minutes at 400° C. | after heating for 30 minutes at 700° C. |
| Example | 2-28 | (P6) | 0.5 μm | ◯ | ◯ | ◯ |
| | 2-29 | (P7) | 1.5 μm | ◯ | ◯ | ◯ |
| | 2-30 | (P8) | 0.8 μm | ◯ | ◯ | ◯ |
| | 2-31 | (P9) | 0.7 μm | ◯ | ◯ | ◯ |

5. Manufacture of Silicon-Containing Polymer

Example 3-1

Into a four-neck flask provided with a stirrer, a reflux condenser, a dropping funnel and a thermometer were added 44.4 g (0.27 mole) of triethoxysilane, 4.4 g (0.03 mole) of vinyltrimethoxysilane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C.

After dripping was completed, circulation was continued for four hours at 75° C. Subsequently water was added in the amount of 150 g to the reaction system, and the product was separated into two layers by allowing the mixture to stand. The bottom layer containing a polymer component was divided, and the top layer was extracted using 100 g of toluene. Then the toluene extract and the polymer component were combined and returned to a flask equipped with a receptacle for measuring water content, and the water and ethanol were evaporated by azeotropy. The product was cooled, filtered and concentrated, and 14.5 g of silicon-containing polymer (Q1) were obtained. The yield was 87%.

The physical properties of silicon-containing polymer (Q1) above were as follows, and the product was confirmed to be the silicon-containing polymer represented by the formula (27) below.

$$[H-Si-O_{3/2}]_l[CH_2=CH-Si-O_{3/2}]_m \qquad (27)$$

(In the formula, l:m=0.9:0.1.)

Molecular weight (GPC, tetrahydrofuran solvent, determined by using polystyrene as the standard):
Mw=4.5×10³
Mn=3.1×10³
Viscosity (25° C.): 4.3×10⁰ Pa·s
¹H-NMR δ (ppm): 4.2 to 4.7(br, 3H), 5.4 to 6.2 (br, 1H)
²⁹Si-NMR δ (ppm): −89 to −82(br, 1Si), −70 to −63(br, 0.11Si)

The silicon-containing polymer (Q1) which was obtained in Example 3-1 was dissolved in an organic solvent such as methanol, ethanol, tetrahydrofuran, toluene, dimethyl formamide, methylisobutylketone, isoamyl acetate, hexane and carbon tetrachloride.

Example 3-2

Into a four-neck flask provided with a stirrer, a reflux condenser, a dropping funnel and a thermometer were added 44.4 g (0.27 mole) of triethoxysilane, 6.7 g (0.03 mole) of p-styryl trimethoxysilane and 37.0 g of toluene. Then a mixture of 20 g of water, 0.5 g of concentrated hydrochloric acid, and 10 g of ethanol was dripped over the course of approximately one hour and reacted while the mixture was heated and stirred at a temperature of 70° C. After that, separation and concentration were conducted in the same manner as in Example 3-1 to obtain 16.9 g of silicon-containing polymer (Q2). The yield was 89%.

The physical properties of silicon-containing polymer (Q2) above were as follows, and the product was confirmed to be the silicon-containing polymer represented by the formula (28) below.

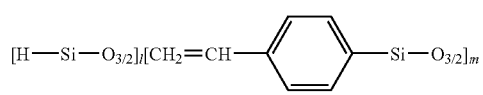
(28)

(In the formula, l:m=0.9:0.1.)

Molecular weight (GPC, tetrahydrofuran solvent, determined by using polystyrene as the standard):
Mw=7.4×10³
Mn=3.8×10³
Viscosity (25° C.): 8.3×10¹ Pa·s
¹H-NMR δ (ppm): 4.2 to 5.0 (br, 3H), 5.4 to 6.2 (br, 1H), 7.1 to 7.8 (br, 1.3H)
²⁹Si-NMR δ (ppm): −89 to −82 (br, 1Si), −70 to −63 (br, 0.11Si)

The silicon-containing polymer (Q2) which was obtained in Example 3-2 was dissolved in an organic solvent such as methanol, ethanol, tetrahydrofuran, toluene, dimethyl formamide, methylisobutylketone, isoamyl acetate, hexane and carbon tetrachloride.

Example 3-3

Into a four-neck flask provided with a stirrer, a reflux condenser, a dropping funnel and a thermometer were added 34.5 g (0.21 mole) of triethoxysilane, 4.4 g (0.03 mole) of vinyltrimethoxysilane, 4.0 g (0.03 mole) of 1,1,3,3-tetramethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 3-1 to obtain 16.7 g of silicon-containing polymer (Q3). The yield was 88%.

The physical properties of silicon-containing polymer (Q3) above were as follows, and the product was confirmed to be the silicon-containing polymer represented by the formula (29) below.

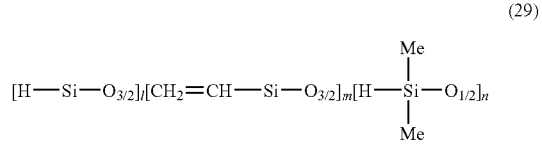
(29)

(In the formula, l:m:n=0.7:0.1:0.2.)

Molecular weight (GPC, tetrahydrofuran solvent, determined by using polystyrene as the standard):
Mw=2.2×10³
Mn=1.2×10³
Viscosity (25° C.): 1.1×10⁰ Pa·s
¹H-NMR δ (ppm): −0.4 to 0.4 (br, 4H), 4.2 to 4.7 (br, 3H), 5.4 to 6.2 (br, 1H)
²⁹Si-NMR δ (ppm): −89 to −82 (br, 1Si), −70 to −63 (br, 0.15Si), −12 to −5 (br, 0.29Si)

The silicon-containing polymer (Q3) which was obtained in Example 3-3 was dissolved in an organic solvent such as methanol, ethanol, tetrahydrofuran, toluene, dimethyl formamide, methylisobutylketone, isoamyl acetate, hexane and carbon tetrachloride.

Example 3-4

Into a four-neck flask provided with a stirrer, a reflux condenser, a dropping funnel and a thermometer were added 25.0 g (0.12 mole) of tetraethoxysilane, 14.8 g (0.09 mole) of triethoxysilane, 4.4 g (0.03 mole) of vinyltrimethoxysilane, 4.0 g (0.03 mole) of 1,1,3,3-tetramethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 3-1 to obtain 16.9 g of silicon-containing polymer (Q4). The yield was 92%.

The physical properties of silicon-containing polymer (Q4) above were as follows, and the product was confirmed to be the silicon-containing polymer represented by the formula (30) below.

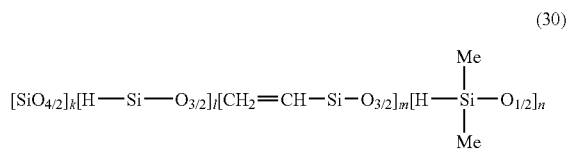

(In the formula, k:l:m:n=0.4:0.3:0.1:0.2.)

Molecular weight (GPC, tetrahydrofuran solvent, determined by using polystyrene as the standard):
Mw=5.8×10³
Mn=2.2×10³
Viscosity (25° C.): 1.2×10¹ Pa·s
¹H-NMR δ (ppm): −0.4 to 0.4 (br, 4H), 4.2 to 4.7 (br, 1.6H), 5.4 to 6.2 (br, 1H)
²⁹Si-NMR δ (ppm): −112 to −105 (br, 1Si), −89 to −82 (br, 0.75Si), −70 to −63 (br, 0.25Si), −12 to −5 (br, 0.49Si)

The silicon-containing polymer (Q4) which was obtained in Example 3-4 was dissolved in an organic solvent such as methanol, ethanol, tetrahydrofuran, toluene, dimethyl formamide, methylisobutylketone, isoamyl acetate, hexane and carbon tetrachloride.

Example 3-5

Into a four-neck flask provided with a stirrer, a reflux condenser, a dropping funnel and a thermometer were added 37.5 g (0.18 mole) of tetraethoxysilane, 4.9 g (0.03 mole) of triethoxysilane, 4.4 g (0.03 mole) of vinyltrimethoxysilane, 4.0 g (0.03 mole) of 1,1,3,3-tetramethyldisiloxane and 37.0 g of toluene. Then a mixture of 20 g of water, 0.5 g of concentrated hydrochloric acid and 10 g of ethanol was dripped over the course of approximately one hour and was reacted while the mixture was heated and stirred at a temperature of 70° C. After that, separation and concentration were conducted in the same manner as in Example 3-1 to obtain 17.7 g of silicon-containing polymer (Q5). The yield was 94%.

The physical properties of silicon-containing polymer (Q5) above were as follows, and the product was confirmed to be the silicon-containing polymer represented by the formula (31) below.

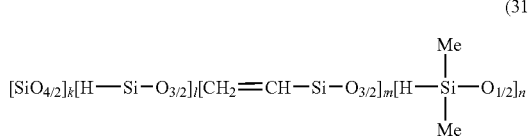

(In the formula, k:l:m:n=0.6:0.1:0.1:0.2.)

Molecular weight (GPC, tetrahydrofuran solvent, determined by using polystyrene as the standard):
Mw=8.2×10³
Mn=3.2×10³
Viscosity (25° C.): 2.3×10¹ Pa·s
¹H-NMR δ (ppm): −0.4 to 0.4 (br, 4H), 4.2 to 4.7 (br, 1H), 5.4 to 6.2 (br, 1H)
²⁹Si-NMR δ (ppm): −112 to −105 (br, 1Si), −89 to −82 (br, 0.17Si), −70 to −63 (br, 0.16Si), −12 to −5 (br, 0.50Si)

The silicon-containing polymer (Q5) which was obtained in Example 3-1 was dissolved in an organic solvent such as methanol, ethanol, tetrahydrofuran, toluene, dimethyl formamide, methylisobutylketone, isoamyl acetate, hexane and carbon tetrachloride.

6. Preparation and Evaluation of Heat-Resistant Resin Composition

Example 3-6

Ten grams of silicon-containing polymer (Q1) obtained in Example 3-1 and 1 mg of chloroplatinic acid were stirred for five minutes at room temperature to mix, and then were heated for one hour at a temperature of 120° C. Thereby a resin composition was obtained. When the solubility of the composition was examined using a lower alcohol, a ketone, and the like, it was insoluble.

In addition, this resin composition was analyzed by thermogravimetry. And when the composition was heated from 25° C. to 1,000° C. at a rate of temperature increase of 10° C./minute in nitrogen atmosphere, the weight loss rate was 1.2%. When the composition was heated in air atmosphere under the same conditions, the weight loss rate thereof was 2.3% (see Table 7).

Further, according to DSC, behavior considered to be glass transition point was not clearly confirmed in a temperature range up to 500° C.

The term "insoluble, infusible" in Table 7 means characteristic that the composition was insoluble in an organic solvent, and that the composition did not melt when heated.

Examples 3-7 through 3-10

Resin compositions were prepared using silicon-containing polymers (Q2) through (Q5) obtained in Examples 3-2 through 3-5, and were evaluated in the same manner as in Example 3-6. The results thereof are shown in Table 3.

TABLE 7

| | | Silicon-containing polymer | Property (after heating for 1 hour at 120° C.) | Thermal weight loss rate in nitrogen atmosphere at 1000° C. | Thermal weight loss rate in air atmosphere at 1000° C. |
|---|---|---|---|---|---|
| Example | 3-6 | (Q1) | Insoluble and infusible | 1.2% | 2.3% |
| | 3-7 | (Q2) | Insoluble and infusible | 3.7% | 6.4% |
| | 3-8 | (Q3) | Insoluble and infusible | 1.6% | 2.7% |
| | 3-9 | (Q4) | Insoluble and infusible | 1.3% | 2.2% |
| | 3-10 | (Q5) | Insoluble and infusible | 1.8% | 2.5% |

7. Manufacture and Evaluation of Heat-Resistant Film

Example 3-11

0.9 g of tetrahydrofuran was added to 0.1 g of silicon-containing polymer (Q1) obtained in Example 3-1 to prepare a resin solution.

After that, this resin solution was applied to a silicon wafer having a diameter of 3 inches by spin coating for 30 seconds at a speed of 1,000 rpm. Subsequently, the coated product was immediately heated at 110° C. for 10 minutes, and a film having a thickness of 0.5 μm was obtained. This film was smooth and free of cracks. In addition, when the film thus obtained was heated under conditions of 400° C. for 30 minutes and 700° C. for 30 minutes, there was no cracking (see Table 8). In the column showing the condition of the film in Table 8, "○" indicates instances in which there was no cracking, and "x" indicates instances in which cracking occurred.

Examples 3-12 Through 3-15

Films were formed on silicon wafers using silicon-containing polymers (Q2) through (Q5) obtained in Examples 3-2 through 3-5 in the same manner as in Example 3-11, and the same evaluation was performed. The results thereof were shown in Table 8.

TABLE 8

|  |  | Silicon-containing polymer | Thickness of film | Condition of film | | |
|---|---|---|---|---|---|---|
|  |  |  |  | after heating for 10 minutes at 110° C. | after heating for 30 minutes at 400° C. | after heating for 30 minutes at 700° C. |
| Example | 3-11 | (Q1) | 0.8 µm | ◯ | ◯ | ◯ |
|  | 3-12 | (Q2) | 1.0 µm | ◯ | ◯ | ◯ |
|  | 3-13 | (Q3) | 0.5 µm | ◯ | ◯ | ◯ |
|  | 3-14 | (Q4) | 0.7 µm | ◯ | ◯ | ◯ |
|  | 3-15 | (Q5) | 0.9 µm | ◯ | ◯ | ◯ |

The invention claimed is:

1. An alkali-soluble silicon-containing polymer which is represented by general formula (1) below and has a weight-average molecular weight in the range from 500 to 500,000:

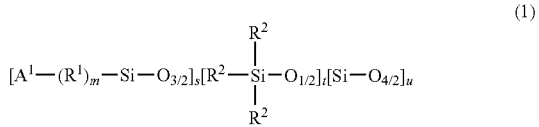
(1)

wherein $A^1$ is a phenyl group having a hydroxyl group and/or an alkoxy group; $R^1$ is an alkylene group of 1-4 carbons; m is 1; $R^2$ is an alkyl group of 1-4 carbons; $R^2$ in one molecule is optionally the same type or a combination of two or more different types; each of s and u is a positive number; t is 0 or a positive number; and $0 \leq t/(s+u) \leq 1$; and $0 < u/s \leq 5$.

2. The alkali-soluble silicon-containing polymer according to claim 1, wherein $0 \leq t/(s+u) \leq 0.2$ and $0.2 < u/s \leq 5$ and said polymer is solid at room temperature.

3. A method for manufacturing the alkali-soluble silicon-containing polymer according to claim 1, comprising performing hydrolytic co-condensation of s moles of an organosilane having a hydrolysable group represented by general formula (2) below, t moles of an organosilane having a hydrolysable group represented by general formula (3) below, and u moles of a silicon compound having a hydrolysable group represented by general formula (4) below, wherein s and u are positive numbers; t is 0 or a positive number; $0 \leq t/(s+u) \leq 1$; and $0 < u/s \leq 5$, $$A^1(R^1)_m SiM^1_3 \quad (2)$$

wherein $A^1$ is a phenyl group having either a hydroxyl group or an alkoxy group; $R^1$ is an alkylene group of 1-4 carbons; $M^1$ is a hydrolysable group; and m is 1,

(3)

wherein $R^2$ is an alkyl group of 1-4 carbons; and $M^2$ is a hydrolysable group, $$SiM^3_4 \quad (4)$$

wherein $M^3$ is a hydrolysable group.

4. The alkali-soluble silicon-containing polymer according to claim 1, wherein $A^1$ is a phenyl group having an alkoxy group.

5. The alkali-soluble silicon-containing polymer according to claim 1, wherein $A^1$ is selected from the group consisting of o-hydroxyphenyl group, m-hydroxyphenyl group, p-hydroxyphenyl group, 2,3-dihydroxyphenyl group, 2,4-dihydroxyphenyl group, 3,4-dihydroxyphenyl group, 3,5-dihydroxyphenyl group, o-methoxyphenyl group, m-methoxyphenyl group, p-methoxyphenyl group, 2,3-dimethoxyphenyl group, 2,4-dimethoxyphenyl group, 3,4-dimethoxyphenyl group, 3,5-dimethoxyphenyl group, o-ethoxyphenyl group, m-ethoxyphenyl group, p-ethoxyphenyl group, 2,3-diethoxyphenyl group, 2,4-diethoxyphenyl group, 3,4-diethoxyphenyl group, 3,5-diethoxyphenyl group, o-isopropoxyphenyl group, m-isopropoxyphenyl group, p-isopropoxyphenyl group, 2,3-di-isopropoxyphenyl group, 2,4-di-isopropoxyphenyl group, 3,4-di-isopropoxyphenyl group, 3,5-di-isopropoxyphenyl group, ortho-tert-butoxyphenyl group, meta-tert-butoxyphenyl group, p-tert-butoxyphenyl group, 2,3-di-tert-butoxyphenyl group, 2,4-di-tert-butoxyphenyl group, 3,4-di-tert-butoxyphenyl group, 3,5-di-tert butoxyphenyl group, 2-methoxy-3-hydroxyphenyl group, 2-methoxy-4-hydroxyphenyl group, 3-methoxy-4-hydroxyphenyl group, 3-methoxy-5-hydroxyphenyl group, 2-hydroxy-3-methoxyphenyl group, 2-hydroxy-4-methoxyphenyl group, 3-hydroxy-4-methoxyphenyl group, 3-hydroxy-5-methoxyphenyl group, 2-ethoxy-3-hydroxyphenyl group, 2-ethoxy-4-hydroxyphenyl group, 3-ethoxy-4-hydroxyphenyl group, 3-ethoxy-5-hydroxyphenyl group, 2-hydroxy-3-ethoxyphenyl group, 2-hydroxy-4-ethoxyphenyl group, 3-hydroxy-4-ethoxyphenyl group, and 3-hydroxy-5-ethoxyphenyl group.

6. The alkali-soluble silicon-containing polymer according to claim 1, wherein $R^1$ is at least one of methylene group, ethylene group, n-propylene group, i-propylene group, n-butylene group and i-butylene group.

7. The alkali-soluble silicon-containing polymer according to claim 1, wherein $R^2$ is at least one of methyl group, ethyl group, n-propyl group, i-propyl group, n-butyl group, i-butyl group.

8. The method according to claim 3, wherein $A^1$ is a phenyl group having an alkoxy group.

9. The alkali-soluble silicon-containing polymer according to claim 1, wherein the polymer is represented by general formula (1) below and has a weight-average molecular weight in the range from 500 to 500,000:

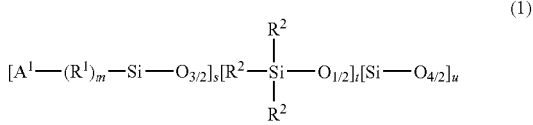
(1)

wherein $A^1$ is a phenyl group having either a hydroxyl group or an alkoxy group; $R^1$ is an alkylene group of 1-4 carbons; m is 1; $R^2$ is an alkyl group of 1-4 carbons; $R^2$ in one molecule is optionally the same type or a combination of two or more different types; each of s and u is a positive number; t is 0 or a positive number; and $0 \leq t/(s+u) \leq 1$; and $0 < u/s \leq 5$.

* * * * *